United States Patent
Ranta et al.

(10) Patent No.: US 11,575,351 B2
(45) Date of Patent: *Feb. 7, 2023

(54) RF SWITCH WITH SPLIT TUNABLE MATCHING NETWORK

(71) Applicant: pSemi Corporation, San Diego, CA (US)

(72) Inventors: Tero Tapio Ranta, San Diego, CA (US); Chih-Chieh Cheng, Poway, CA (US); Kevin Roberts, Rohnert Park, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/243,038

(22) Filed: Apr. 28, 2021

(65) Prior Publication Data

US 2021/0336588 A1 Oct. 28, 2021

Related U.S. Application Data

(63) Continuation of application No. 16/752,330, filed on Jan. 24, 2020, now Pat. No. 11,005,432, which is a
(Continued)

(51) Int. Cl.
*H03F 1/56* (2006.01)
*H03F 3/19* (2006.01)
(Continued)

(52) U.S. Cl.
CPC .............. *H03F 1/56* (2013.01); *H03F 3/19* (2013.01); *H03F 3/195* (2013.01); *H03F 3/213* (2013.01);
(Continued)

(58) Field of Classification Search
CPC ... H03F 1/56; H03F 3/19; H03F 3/195; H03F 3/213; H03F 2200/378; H03F 2200/387; H03F 2200/451
(Continued)

(56) References Cited

U.S. PATENT DOCUMENTS 7,706,759 B2   4/2010   Rofougaran
7,795,968 B1   9/2010   Li et al.
(Continued)

OTHER PUBLICATIONS

Nguyen, Hieu P., Notice of Allowance received from the USPTO dated Jan. 31, 2018 for U.S. Appl. No. 15/372,260, 7 pgs.
(Continued)

*Primary Examiner* — Hieu P Nguyen
(74) *Attorney, Agent, or Firm* — Jaquez Land Greenhaus & McFarland; John Land, Esq.

(57) ABSTRACT

An improved architecture for a radio frequency (RF) power amplifier, impedance matching network, and selector switch. One aspect of embodiments of the invention is splitting the functionality of a final stage impedance matching network (IMN) into two parts, comprising a base set of off-chip IMN components and an on-chip IMN tuning component. The on-chip IMN tuning component may be a digitally tunable capacitor (DTC). In one embodiment, an integrated circuit having a power amplifier, an on-chip IMN tuner, and a selector switch is configured to be coupled to an off-chip set of IMN components. In another embodiment, an integrated circuit having an on-chip IMN tuner and a selector switch is configured to be coupled through an off-chip set of IMN components to a separate integrated circuit having an RF power amplifier.

20 Claims, 7 Drawing Sheets

Related U.S. Application Data continuation of application No. 16/029,333, filed on Jul. 6, 2018, now Pat. No. 10,581,387, which is a continuation of application No. 15/372,260, filed on Dec. 7, 2016, now Pat. No. 10,038,414.

(51) Int. Cl.
*H03F 3/195* (2006.01)
*H03F 3/213* (2006.01)

(52) U.S. Cl.
CPC .. *H03F 2200/378* (2013.01); *H03F 2200/387* (2013.01); *H03F 2200/451* (2013.01)

(58) Field of Classification Search
USPC .................................................. 330/302–306
See application file for complete search history.

(56) References Cited

U.S. PATENT DOCUMENTS

| | | | |
|---|---|---|---|
| 7,864,133 B2* | 1/2011 | Rofougaran | H01Q 9/145 343/745 |
| 8,466,745 B2 | 6/2013 | Guo | |
| 9,024,700 B2 | 5/2015 | Ranta | |
| 9,276,527 B2 | 3/2016 | Gaynor | |
| 9,294,056 B2 | 3/2016 | Nobbe et al. | |
| 9,712,197 B2 | 7/2017 | Ripley et al. | |
| 10,038,414 B2 | 7/2018 | Ranta et al. | |
| 10,581,387 B2 | 3/2020 | Ranta et al. | |
| 10,643,962 B1 | 5/2020 | Ichitsubo | |
| 11,005,432 B2 | 5/2021 | Ranta et al. | |
| 2014/0266433 A1 | 9/2014 | Nobbe et al. | |
| 2017/0346516 A1 | 11/2017 | Ripley et al. | |
| 2018/0159486 A1 | 6/2018 | Ranta et al. | |
| 2019/0140602 A1 | 5/2019 | Ranta et al. | |
| 2020/0235709 A1 | 7/2020 | Ranta et al. | |

OTHER PUBLICATIONS

Nguyen, Hieu P., Notice of Allowance received from the USPTO dated May 24, 2018 for U.S. Appl. No. 15/372,260, 11 pgs.

Ranta, et al., Response filed in the USPTO dated Nov. 16, 2017 for U.S. Appl. No. 15/372,260, 13 pgs.

Nguyen, Hieu P., Office Action received from the USPTO dated Sep. 5, 2017 for U.S. Appl. No. 15/372,260, 12 pgs.

Nguyen, Hieu P., Office Action received from the USPTO dated Jun. 7, 2019 for U.S. Appl. No. 16/029,333, 9 pgs.

Nguyen, Hieu P., Notice of Allowance received from the USPTO dated Oct. 22, 2019 for U.S. Appl. No. 16/029,333, 7 pgs.

PSEMI Corporation, Preliminary Amendment filed in the USPTO dated Sep. 5, 2018 for U.S. Appl. No. 16/029,333, 4 pgs.

PSEMI Corporation, Preliminary Amendment filed in the USPTO dated Sep. 9, 2019 for U.S. Appl. No. 16/029,333, 5 pgs.

Nguyen, Hieu P., Office Action received from the USPTO dated Aug. 18, 2020 for U.S. Appl. No. 16/752,330, 11 pgs.

Nguyen, Hieu P., Notice of Allowance received from the USPTO dated Jan. 12, 2021 for U.S. Appl. No. 16/752,330, 8 pgs.

\* cited by examiner

RF SWITCH WITH SPLIT TUNABLE MATCHING NETWORK

CROSS REFERENCE TO RELATED APPLICATIONS—CLAIM OF PRIORITY

This application is a continuation of commonly owned and co-pending U.S. patent application Ser. No. 16/752,330, filed Jan. 24, 2020, entitled "RF Switch with Split Tunable Matching Network" to issue as U.S. Pat. No. 11,005,432 on May 11, 2021, the disclosure of which is incorporated herein by reference in its entirety; which application Ser. No. 16/752,330 is a continuation of commonly owned and co-pending U.S. patent application Ser. No. 16/029,333, filed Jul. 6, 2018, entitled "RF Switch with Split Tunable Matching Network" now U.S. Pat. No. 10,581,387 issued Mar. 3, 2020, the disclosure of which is incorporated herein by reference in its entirety; which application Ser. No. 16/029,333 is a continuation of commonly owned U.S. patent application Ser. No. 15/372,260 filed Dec. 7, 2016, entitled "RF Switch with Split Tunable Matching Network", now U.S. Pat. No. 10,038,414, issued Jul. 31, 2018, the disclosure of which is incorporated herein by reference in its entirety.

BACKGROUND

(1) Technical Field

This invention relates to electronic radio frequency power amplifier and selector switch circuitry.

(2) Background

Typical electronic power amplifiers use fixed output impedance matching networks (IMNs) to transform the low impedance of the power amplifier device (e.g., 3 ohms) to the characteristic impedance of an electronic system as a whole (e.g., 50 ohms, for modern radio frequency circuitry). IMNs can be built using a variety of architectures, including lumped elements (e.g., inductors and capacitors), distributed elements (e.g., transmission lines), and/or transformers.

The circuit architecture, topology, and component values of IMNs are generally selected to provide desired performance parameters, such as impedance transformation (e.g., from 3 ohms to 50 ohms), frequency response (e.g., low pass), and harmonic termination (e.g., presenting a short circuit at the second harmonic frequency, 2f0, of the fundamental system frequency f0, but an open circuit at the third harmonic frequency, 3f0). Additional IMN design considerations may include sufficient bandwidth to fully cover a desired operating frequency range (e.g., 698-915 MHz) and low dissipative loss (e.g., <0.5 dB). In general, these and other design parameters may be fully or partially mutually dependent, such that variation of one parameter affects another parameter.

In light of the number of parameters affecting the design of an IMN, it is often difficult to synthesize a fixed (non-tunable) IMN that simultaneously fulfills all design requirements while providing enough bandwidth to cover a desired range of operating frequencies. Often performance at the edges of frequency bands suffers when attempting to make a wideband IMN. Accordingly, a better solution frequently is a tunable or dynamically tunable IMN ("tunable" generally means setting a circuit during production to one of several possible tuned states, while "dynamically tunable" generally means setting a circuit to one or more of several possible states dynamically or "on the fly" in the field; however, for ease of reference in this description, the term "tunable" is meant to cover both tunable and dynamically tunable unless otherwise indicated).

FIG. 1 is a block diagram of a prior art fully integrated radio frequency (RF) transmitter power amplifier and mode switch architecture 100. For RF transmitters, an RF "front end" is a generic term for all of the circuitry between an RF amplifier up to a radio antenna; accordingly, FIG. 1 shows most of the transmission side of an RF front end. In the illustrated example, an integrated circuit (IC) 102 includes several subcircuits that accept an RF input signal RFIN and output an amplified and impedance matched output signal RFOUT to a selected destination (e.g., one or more band filters and/or antenna ports); the IC 102 may also be referred to as a "chip" or "die".

More specifically, an input IMN 104 impedance matches the input signal RFIN to a power amplifier (PA) driver circuit 106. An interstage IMN 108 couples the output of the PA driver circuit 106 to a PA final stage 110. The interstage IMN 108 may be optional for some embodiments, but for two or more stage amplifiers, some form of interstage matching network is generally needed, even though it may be just a single component (e.g., a series capacitor). The amplified RF output of the PA final stage 110 is coupled to a tunable final stage IMN 112, the output of which is coupled through a DC blocking capacitor $C_{DC}$ to the input port of a selector switch 114. The selector switch 114 routes a signal applied to its input port as an output signal RFOUT along one or more output paths to coupled circuitry (not shown), such as different RF band filters and/or antenna paths. In this example, an off-chip choke circuit 116 prevents the amplified RF signal from the PA final stage 110 from being adversely affected by a DC power supply (not shown), essentially making the DC power supply invisible from the point of view of the RF circuitry. Such choke circuits may also be used with other stages, such as the driver 106 (not shown). The DC blocking capacitor $C_{DC}$ generally would be integrated on the IC 101 to reduce pin count, interconnect parasitics, and the number of external components.

The tunable final stage IMN 112 may be implemented in a number of ways, including a variety of circuits having tunable inductors and/or capacitors. In some embodiments, the input IMN 104 and/or the interstage IMN 108 may be fixed, but also may be tunable (for example, to optimize impedance matching for a selected RF frequency band). The particular power amplifier and mode switch architecture 100 example shown in FIG. 1 has two amplifier stages (the PA driver circuit 106 and the PA final stage 110), but other embodiments may have fewer or more than two amplifier stages.

FIG. 1 is an example of a fully integrated RF architecture with both PA, tunable impedance matching, and selector switch integrated on a single IC 102. This architecture provides quite good tunability and few off-chip parasitic elements (e.g., bonding wire parasitic inductance, capacitance, and/or resistance), but may have lower output power and efficiency due to lossy integrated inductors within the final stage IMN 112. Further, the inclusion of on-chip inductors increases the overall circuit size, and thus the cost of integrated circuit fabrication, and may limit the range of tunability. Further, changing integrated inductors requires an IC mask change—or an IC redesign in the worst case—whereas external inductors are easier to change and optimize for particular product specifications.

FIG. 2 is a block diagram of a prior art partially integrated RF transmitter power amplifier and mode switch architecture 200 having an off-chip final stage IMN 212. In the illustrated example, an IC 202 includes most of the on-chip circuitry of the example IC 102 shown in FIG. 1, with the exception that the final stage IMN 212 is off-chip. In this example, the off-chip final stage IMN 212 is shown as tunable (e.g., settable at the time of production), but may be fixed. An off-chip final stage IMN 212 can include high-Q inductors to achieve low loss, easy adjustability through part design, and faster time-to-market through part changes (e.g., for an RF power amplifier IC intended for use in different markets, such as for GSM, LTE, and CDMA cellular telephones). However, off-chip implementation of the final stage IMN 212 introduces parasitic elements that are generally difficult to counteract in order to achieve good performance and meet design criteria.

Accordingly, there is a need for an improved architecture for an RF power amplifier, impedance matching network, and selector switch that allows for good tunability and design flexibility over a desired range of frequency bands, good bandwidth, good power output and efficiency, low loss, easy adjustability, low cost, and faster time-to-market. The present invention addresses this need.

SUMMARY OF THE INVENTION

The present invention encompasses an improved architecture for a radio frequency (RF) power amplifier, impedance matching network, and selector switch that allows for good tunability and design flexibility over a desired range of frequency bands, good bandwidth, good power output and efficiency, low loss, easy adjustability, low cost, and faster time-to-market. One aspect of embodiments of the invention is splitting the functionality of a final stage impedance matching network (IMN) into two parts, comprising a base set of off-chip IMN components and an on-chip IMN tuning component.

In one embodiment, an integrated circuit (IC) includes several subcircuits that accept an RF input signal RFIN and output an amplified and impedance matched output signal RFOUT to a selected destination. More specifically, the low impedance output of a power amplifier final stage is coupled to an off-chip set of IMN components, which in turn are coupled to an on-chip IMN tuner. The combination of the off-chip set of IMN components and the on-chip IMN tuner form a tunable final stage impedance matching network, the output of which is coupled through a DC blocking capacitor to a selector switch as RFOUT. In some embodiments, the on-chip IMN tuner may be a digitally tunable capacitor (DTC).

Embodiments of the invention need not be integrated with a power amplifier. For example, a first integrated circuit may include an on-chip IMN tuner and a selector switch, and be configured to be coupled to an off-chip set of IMN components and to a second integrated circuit having an RF power amplifier. Separating the off-chip set of IMN components and the on-chip IMN tuner of the first IC from the RF power amplifier of the second IC allows selection of a particularly well suited fabrication technology for each element of the system, while providing the benefits of integration and tunability.

Splitting the functionality of a final stage impedance matching network for an RF power amplifier into two parts, as well as placing the on-chip IMN tuner in close proximity to the selector switch, provide important advantages, including (among others): the off-chip set of IMN components can be fabricated inexpensively compared to on-chip counterparts, in large part because on-chip inductors of a size sufficient to provide good bandwidth and efficiency take up a large amount of IC die area, and can generally be more efficient than an on-chip implementation; the close proximity of the on-chip IMN tuner to the selector switch allows impedance match tuning that takes into account all of the parasitic elements between the PA final stage and the selector switch, such as the parasitic inductance, capacitance, and/or resistance of the bonding wires to the off-chip set of IMN components; the on-chip IMN tuner of the final stage IMN can be adjusted to accommodate the imperfect input impedance of coupled band filters or even antenna impedance; with an on-chip IMN tuner, such as a DTC, the operating frequencies of the final stage IMN can be made wider; the selector switch and the on-chip IMN tuner (particularly if implemented as a DTC) may be integrated on the same die using the same technology; because the bulk of the final stage IMN components are off-chip, different off-chip IMN components can be utilized with a common IC having a selector switch and an on-chip IMN tuner, thus allowing a single IC to be used for multiple different applications, thereby reducing time-to-market; splitting the functionality as described below enables the use of a split final stage IMN with any PA device fabrication technology; and embodiments of the invention can reduce total die area on an IC by sharing control logic and other analog/digital circuitry with the on-chip IMN tuner and the selector switch.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention encompasses an improved architecture for a radio frequency (RF) power amplifier, impedance matching network, and selector switch that allows for good tunability and design flexibility over a desired range of frequency bands, good bandwidth, good power output and efficiency, low loss, easy adjustability, low cost, and faster time-to-market. One aspect of embodiments of the invention is splitting the functionality of a final stage impedance matching network (IMN) into two parts, comprising a base set of off-chip IMN components and an on-chip IMN tuning component.

Single-IC Split IMN Architecture

Figure 1:
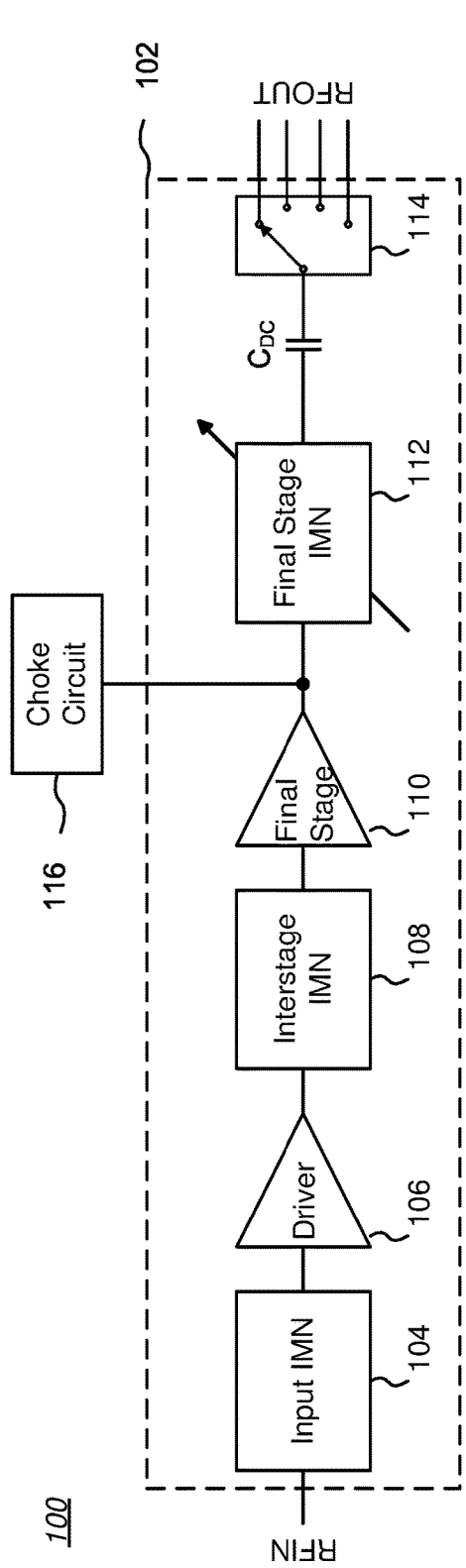
FIG. 1 is a block diagram of a prior art fully integrated radio frequency (RF) transmitter power amplifier and mode switch architecture.
Figure 2:
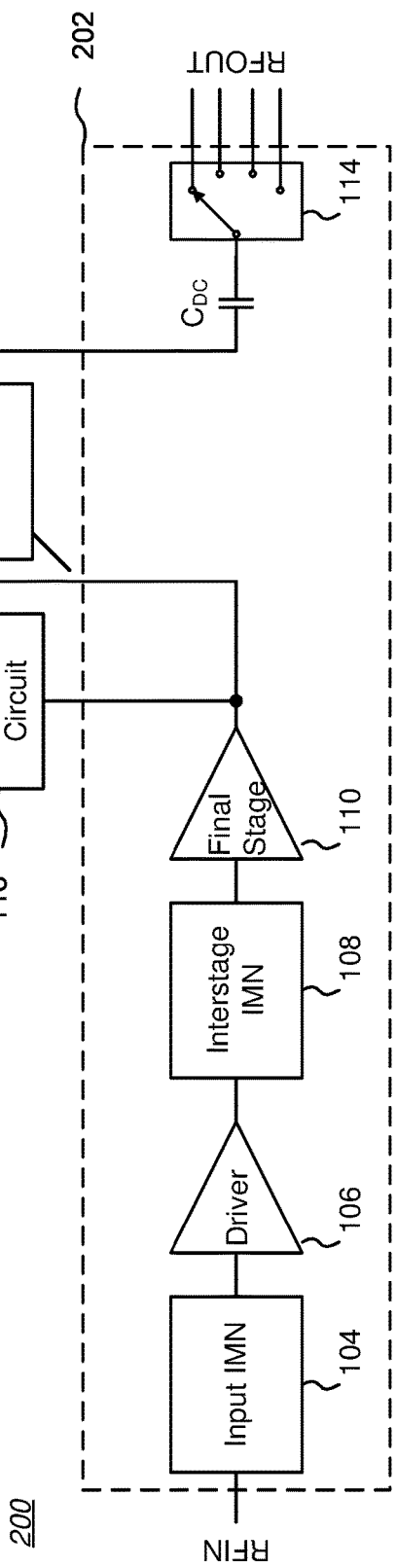
FIG. 2 is a block diagram of a prior art partially integrated RF transmitter power amplifier and mode switch architecture having an off-chip final stage IMN.
Figure 3:
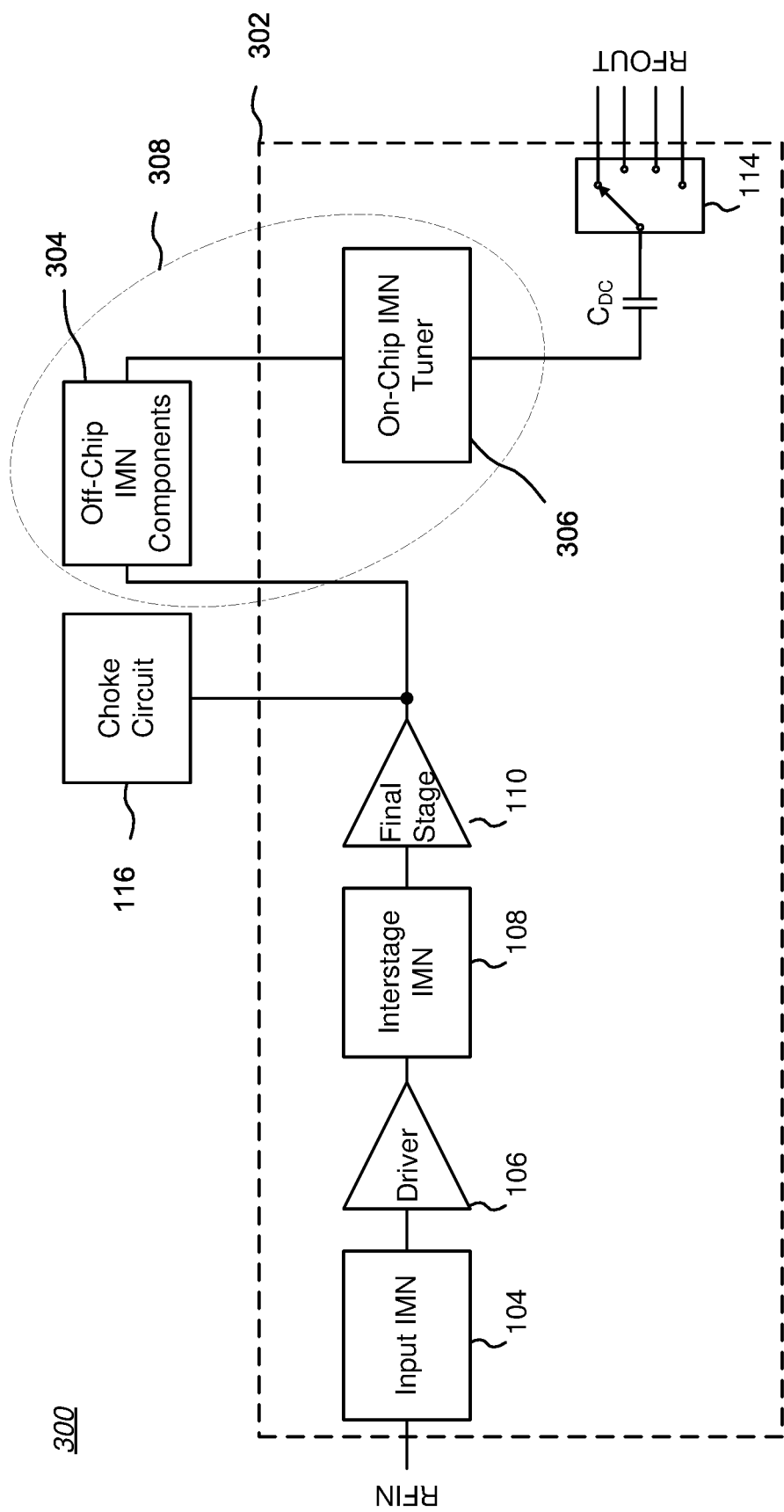
FIG. 3 is a block diagram of a RF power amplifier having a general split IMN architecture.

FIG. 3 is a block diagram of a RF power amplifier 300 having a general split IMN architecture. Similar to FIG. 1 and FIG. 2, an integrated circuit (IC) 302 includes several subcircuits that accept an RF input signal RFIN and output an amplified and impedance matched output signal RFOUT to a selected destination (e.g., one or more antennas, duplexers, band select filters, etc.). More specifically, an input IMN 104 impedance matches the input signal RFIN to a power amplifier (PA) driver circuit 106. An optional interstage IMN 108 couples the output of the PA driver circuit 106 to a PA final stage 110, which amplifies the input signal. An off-chip choke circuit 116 prevents the amplified RF signal from the PA final stage 110 from adversely affecting a DC power supply (not shown).

As discussed above, the low impedance output of the PA final stage 110 (e.g., 3 ohms) requires impedance matching to the characteristic impedance of the electronic system as a whole (e.g., 50 ohms, for modern radio frequency circuitry). However, in contrast to the embodiment of FIG. 1, the amplified RF output of the PA final stage 110 is coupled to an off-chip set of IMN components 304, which in turn are coupled to an on-chip IMN tuner 306. The combination of the off-chip set of IMN components 304 and the on-chip IMN tuner 306 form a tunable final stage IMN 308, the output of which is coupled through a DC blocking capacitor $C_{DC}$ to the input port of a selector switch 114. The DC blocking capacitor $C_{DC}$ generally would be integrated on the IC 302 to reduce pin count, interconnect parasitics, and the number of external components.

The selector switch 114 routes a signal applied to its input port as an output signal RFOUT along one or more output paths to coupled circuitry (not shown), such as different RF band filters and/or antenna paths. The selector switch 114 may be a 1-to-n switch, where n≥1; accordingly, in the simplest case with n=1, the selector switch 114 is a single-pole, single-throw (SPST) switch. In the case of multiple power amplifiers (on-chip or off-chip), the selector switch 114 may be an m-to-n switch (e.g., a matrix switch), where m≥2 and n≥1. As should be clear, the selector switch 114 may also have any other desired switching configuration. A particularly useful way for fabricating the selector switch 114 is by using field effect transistors (FETs), especially MOSFETs, but the invention is not limited to FET implementations, and extends to others switch technologies, including the various types of bipolar junction transistors (BJTs), PIN diodes, and microelectromechanical system (MEMS) switches.

Figure 4A:
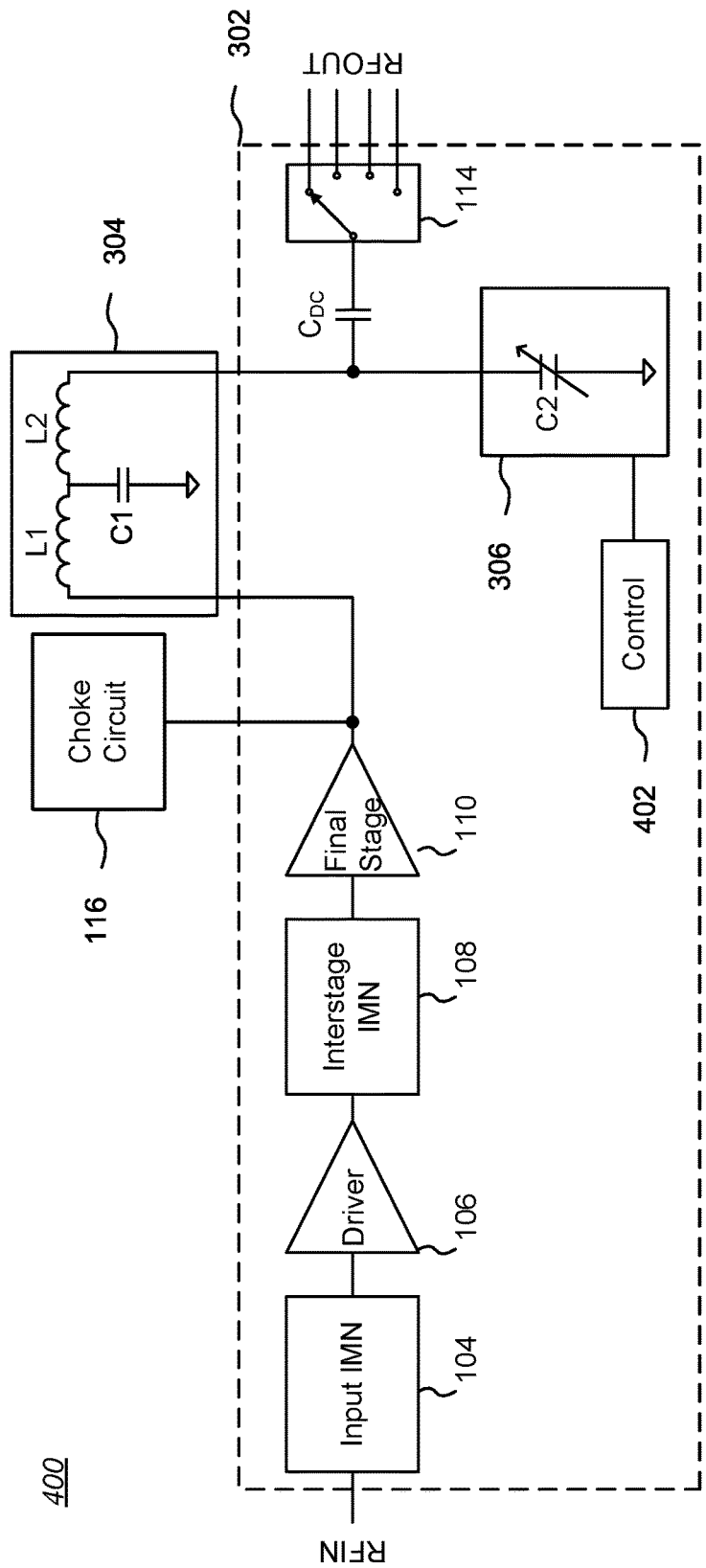
FIG. 4A is a block diagram of a RF power amplifier having a detailed split IMN architecture.

FIG. 4A is a block diagram of a RF power amplifier 400 having a detailed split IMN architecture. The configuration of the RF power amplifier 400 is essentially the same as the RF power amplifier 300 of FIG. 3, but with specific circuitry examples shown for the off-chip set of IMN components 304 and the on-chip IMN tuner 306.

Figure 4B:
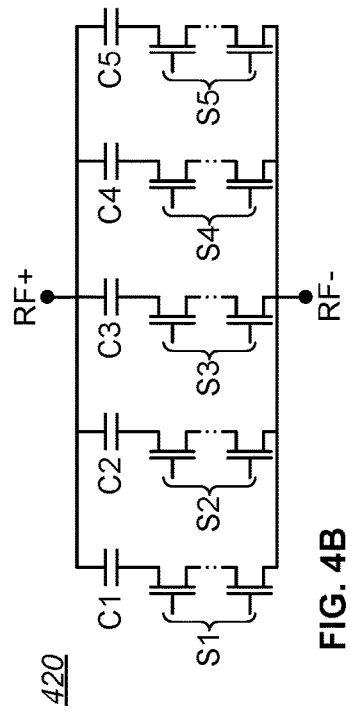
FIG. 4B is a schematic diagram of a 5-bit digitally tunable capacitor that may be used in the circuit of FIG. 4A.

In FIG. 4A, the off-chip set of IMN components 304 may comprise an inductor L1, capacitor C1, and inductor L2 configured as an LCL circuit. One or more of the set of IMN component 304 may be tunable. For example, the capacitor C1 may be a digitally tunable capacitor (DTC), alone or coupled to a fixed capacitor. The DTC may be of the type taught in U.S. Pat. No. 9,024,700, issued on May 5, 2015, entitled "Method and Apparatus for use in Digitally Tuning a Capacitor in an Integrated Circuit Device", assigned to the assignee of the present invention and hereby incorporated by reference. The on-chip IMN tuner 306 is shown as a tunable capacitor C2—which also may be a DTC or a fixed capacitor coupled to a DTC—coupled between the DC blocking capacitor $C_{DC}$ and a reference potential, such as circuit ground. As illustrated, the combination of the inductor L1, capacitor C1, and inductor L2 of the off-chip set of IMN components 304 and the capacitor C2 of the on-chip IMN tuner 306 forms a classic LCLC tunable impedance matching network. FIG. 4B is a schematic diagram of a 5-bit digitally tunable capacitor 420 that may be used in the circuit of FIG. 4A. FIG. 4B shows that the DTC 420 may include a plurality of capacitors C1-C5 each coupled in series at the top of a corresponding stack S1-S5 of FET switches (FIG. 4B is based on FIG. 4C from U.S. Pat. No. 9,024,700 but omits the control logic coupled to the gates of the FETs within the stacks S1-S5 to avoid clutter). Operation is as described in U.S. Pat. No. 9,024,700.

In general, the on-chip IMN tuner 306 should be fabricated in close proximity to the selector switch 114 to minimize parasitic inductance, capacitance, and/or resistance between or affecting those elements. For example, implementing capacitor C2 in FIG. 4 as an integrated DTC in close proximity to the selector switch 114 can reduce parasitic inductance by approximately a factor of 10 to 20 or more compared to an external implementation of capacitor C2 (e.g., about 0.1 nH versus about 1-2 nH). More specifically, C2 (i.e., the on-chip IMN tuner 306), the selector switch 114, and (generally) the blocking capacitor $C_{DC}$ should be integrated in close enough proximity such that the resulting parasitic inductance is less than about 1 nH, and more preferably less than about 0.5 nH, and even more preferably about 0.1 nH or less. In more general terms, the degree of proximity between C2 (i.e., the on-chip IMN tuner 306), the selector switch 114, and (generally) the blocking capacitor $C_{DC}$ should be such that the resonant frequency from parasitic inductance is more than about twice the operating frequency of the circuit.

Multiple-IC Split IMN Architecture

Figure 5:
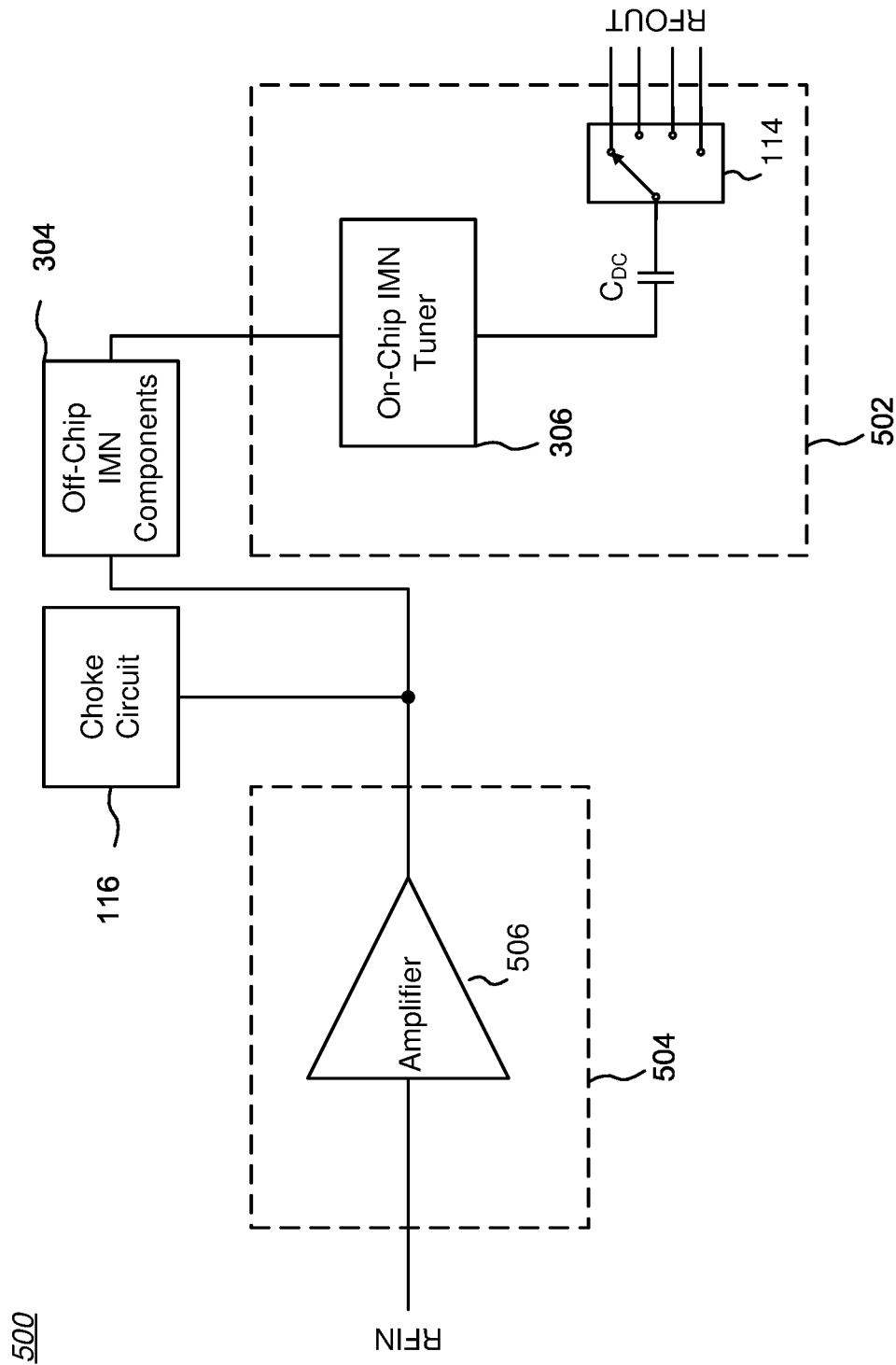
FIG. 5 is a block diagram of an integrated circuit having an on-chip IMN tuner and a selector switch, configured to be coupled to an off-chip set of IMN components and to an integrated circuit having an RF power amplifier.

FIG. 3 and FIG. 4 show a single integrated circuit 302 encompassing a power amplifier, an on-chip IMN tuner 306 as part of a tunable final stage IMN 308, and a selector switch 114. However, embodiments of the invention need not be integrated with a power amplifier. For example, FIG. 5 is a block diagram 500 of an integrated circuit 502 having an on-chip IMN tuner 306 and a selector switch 114, configured to be coupled through an off-chip set of IMN components 304 to a separate integrated circuit 504 having an RF power amplifier 506. As should be clear, no specific architecture for the RF power amplifier 506 is required for use in conjunction with the off-chip set of IMN components 304 and the on-chip IMN tuner 306.

Separating the off-chip set of IMN components 304 and the on-chip IMN tuner 306 from the RF power amplifier IC 504 allows selection of a particularly well-suited fabrication technology for each integrated circuit, while providing the benefits of integration and tunability. For example, the RF power amplifier IC 504 may be fabricated with a desired architecture in a technology best suited for high-power operation or to achieve a smaller die size and potentially better RF performance (e.g., pHEMT, HBT, GaAs, etc.), the off-chip set of IMN components 304 may be fabricated from discrete devices (e.g., wound-wire or chip inductors and chip capacitors), and the IC 502 including the on-chip IMN tuner 306 and the selector switch 114 (along with control circuitry, not shown) may be fabricated in a technology best suited for low quiescent power, high speed operation, integration between switch, tuning, and control functionality, and best electrical performance (e.g., CMOS RF silicon-on-insulator or "SOI", including silicon-on-sapphire or "SOS").

ALTERNATIVE EMBODIMENTS

In alternative embodiments of the invention, other components of the off-chip set of IMN components 304 may be included as part of the on-chip IMN tuner 306. For example, referring to FIG. 4, capacitor C1 could also be integrated within the IC 302, preferably in close proximity to capacitor C2 (although such a configuration would require an additional external connection point, such as a solder bump or wirebond pad, to the remaining elements in the off-chip set of IMN components 304). Thus, even though only one tunable capacitor C2 (e.g., a DTC) is shown within the on-chip IMN tuner 306 in the IC 302 of FIG. 4, any number of elements of the final stage IMN 308 as a whole may be allocated to one of the off-chip set of IMN components 304 or the on-chip IMN tuner 306, so long as at least one element is allocated to each of the off-chip set of IMN components 304 and the on-chip IMN tuner 306. Further, while a particular LCLC impedance matching network topology is shown in FIG. 4, embodiments of the invention may use different impedance matching network topologies for the final stage IMN 308 as a whole.

Embodiments of the invention may include more a complex on-chip IMN tuner 306 than shown in FIG. 4. For example, some RF systems have operational RF modes that require complex RF signal path selection or operation over several frequency ranges; examples include "band switch", "mode switch", "transmit/receive switch", "antenna selection switch", and "carrier aggregation path switch" applications. Accordingly, an IC 302 may include more than one on-chip IMN tuner 306 and/or more than one selector switch 114. Alternatively, multiple ICs 502, each including at least one on-chip IMN tuner 306 and at least one selector switch 114, may be configured to be coupled to one or more RF power amplifier ICs 502 in order to provide for such complex connectivity.

While the description above has been in the context of a power amplifier, the on-chip IMN tuner circuits shown in FIGS. 3-5 apply to low noise amplifiers (LNAs) as well.

Control Circuitry

The tuning values for the on-chip IMN tuner 306 (e.g., capacitor C2 in FIG. 4) may be provided by a coupled control circuit 402 (shown in FIG. 4, but applicable to FIG. 3 and FIG. 5 as well), which may include a look-up table. The selector switch 114 may also be controlled by the control circuit 402, or may be controlled by a separate control circuit (not shown).

Selection of one of several tuning values for the on-chip IMN tuner 306 may be, for example, by means of programmed control signals or words provided from an external source through a digital interface coupled to the control circuit 402, or control signals or words may be indirectly supplied to the on-chip IMN tuner 306 through on-chip combinatorial circuitry or from an on-chip look-up table (e.g., implemented as fuses, PROM, EEPROM, etc.) in the control circuit 402 containing tuning states for various RF bands. Externally supplied control signals or words may be provided through the well-known interfaces specified by the Mobile Industry Processor Interface (MIPI) Alliance, or through the well-known Serial Peripheral Interface (SPI) bus, or by direct signal pins, or by any other convenient means.

Programmed control of the tuning state of the on-chip IMN tuner 306 can be based on a user state selection or external control signals, or be automatically set in response to one or more detected system states or parameters (e.g., selected frequency band, pre-determined lookup values, detected signal frequency, signal strength, power consumption, IC device temperature, etc.), alone or in combination with a user state selection or external control signals, and including use of a feed-forward loop and/or a feed-back loop to dynamically adjust the tuning state. Accordingly, as needed for a particular application, the performance of a power amplifier may be designed to programmatically change in a pre-specified manner or to dynamically change (including through use of a feed-forward loop and/or a feed-back loop) based on real-time conditions. Mapped tuning values may be determined by characterizing circuit models of the IC 302 or fabricated samples of the IC 302, or by calibration of individual units of the IC 302. Other examples of controlling and/or optimizing amplifier operation are described in U.S. patent application Ser. No. 13/828, 121, filed on Mar. 14, 2013, entitled "Systems and Methods for Optimizing Amplifier Operations", assigned to the assignee of the present invention and hereby incorporated by reference.

Advantages of the Invention

Splitting the functionality of a final stage impedance matching network for an RF power amplifier into two parts, as well as placing the on-chip IMN tuner 306 in close proximity to the selector switch 114, provide important advantages, including (among others):

The off-chip set of IMN components 304 can be fabricated inexpensively compared to on-chip counterparts, in large part because on-chip inductors of a size sufficient to provide good bandwidth and efficiency take up a large amount of IC die area in addition, off-chip inductors can generally be more efficient than an on-chip inductors.

The close proximity of the on-chip IMN tuner 306 to the selector switch 114 allows impedance match tuning to be made that takes into account all of the parasitic elements between the PA final stage 110 and the selector switch 114, such as the parasitic inductance, capacitance, and/or resistance of the bonding wires to the off-chip set of IMN components 304.

The tunability of the on-chip IMN tuner 306 also can be used to provide Maximum Power Transfer all the way from the PA final stage 110, through the selector switch 114, and to and/or through components coupled to the selector switch 114, such as output band filters or antenna ports of a radio device (e.g., a cellular radio handset). That is, the on-chip IMN tuner 306 of the final stage IMN 308 can be adjusted to accommodate the imperfect input impedance of coupled band filters or even antenna impedance.

With an on-chip IMN tuner 306, such as a DTC, the operating frequencies of the final stage IMN 308 can be made wider. This allows the response and characteristics of the final stage IMN 308 to be optimized for narrow frequency bands, while using tuning to move the response to any of many desired frequency bands. For example, a tunable final stage IMN 308 may be designed for a selected range of frequencies for a particular modulation scheme, RF channel, or even country of operation, with fine tuning in subbands accomplished by means of the on-chip IMN tuner 306.

The selector switch 114 and the on-chip IMN tuner 306 (particularly if implemented as a DTC) may be integrated on the same die using the same technology (e.g., RF SOI or SOS).

Because the bulk of the final stage IMN 308 components are off-chip, different off-chip IMN components can be utilized with a common IC 302 having a selector switch 114 and an on-chip IMN tuner 306, thus allowing a single IC 302 to be used for multiple different applications, thereby reducing time-to-market.

Splitting the functionality as described above enables the use of a split final stage IMN 308 with any PA device fabrication technology (e.g., pHEMT, HBT, GaAs, CMOS, etc.).

Embodiments of the invention can reduce total die area on an IC 302, 502 by sharing control logic (e.g., MIPI, SPI, or other serial interface) and other analog/digital circuitry with the on-chip IMN tuner 306 and the selector switch 114.

The result is that embodiments of the invention provide for good tunability and design flexibility over a desired range of frequency bands, good bandwidth, good power output and efficiency, low loss, easy adjustability, low cost, and faster time-to-market.

Methods

Figure 6:
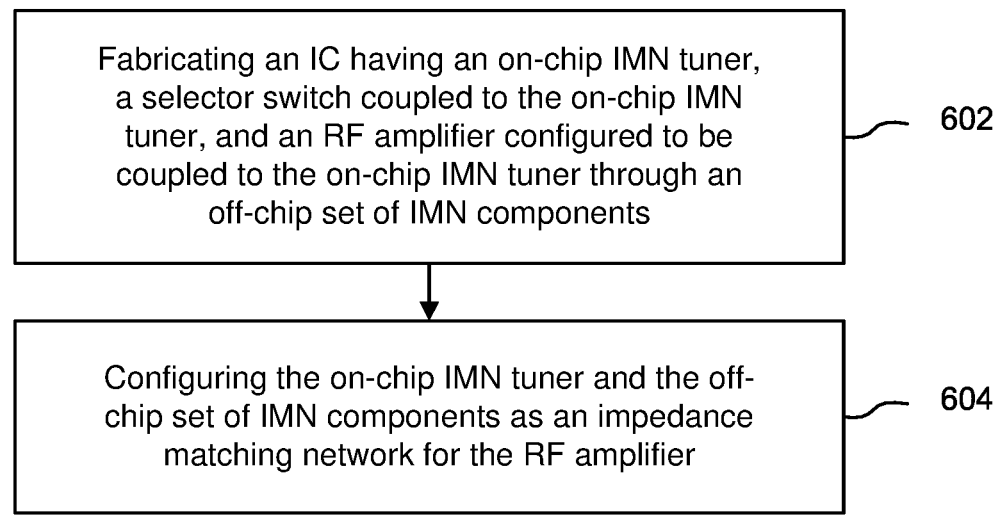
FIG. 6 is a process chart showing a first method for impedance matching an RF amplifier to a coupled selector switch.

Another aspect of the invention includes methods for impedance matching a radio frequency (RF) power amplifier to a coupled selector switch. For example, FIG. 6 is a process chart 600 showing a first method for impedance matching an RF amplifier to a coupled selector switch, including: fabricating an integrated circuit having an on-chip IMN tuner, a selector switch coupled to the on-chip IMN tuner, and an RF amplifier configured to be coupled to the on-chip IMN tuner through an off-chip set of IMN components (STEP 602); and configuring the on-chip IMN tuner and the off-chip set of IMN components as an impedance matching network for the RF amplifier (STEP 604).

Figure 7:
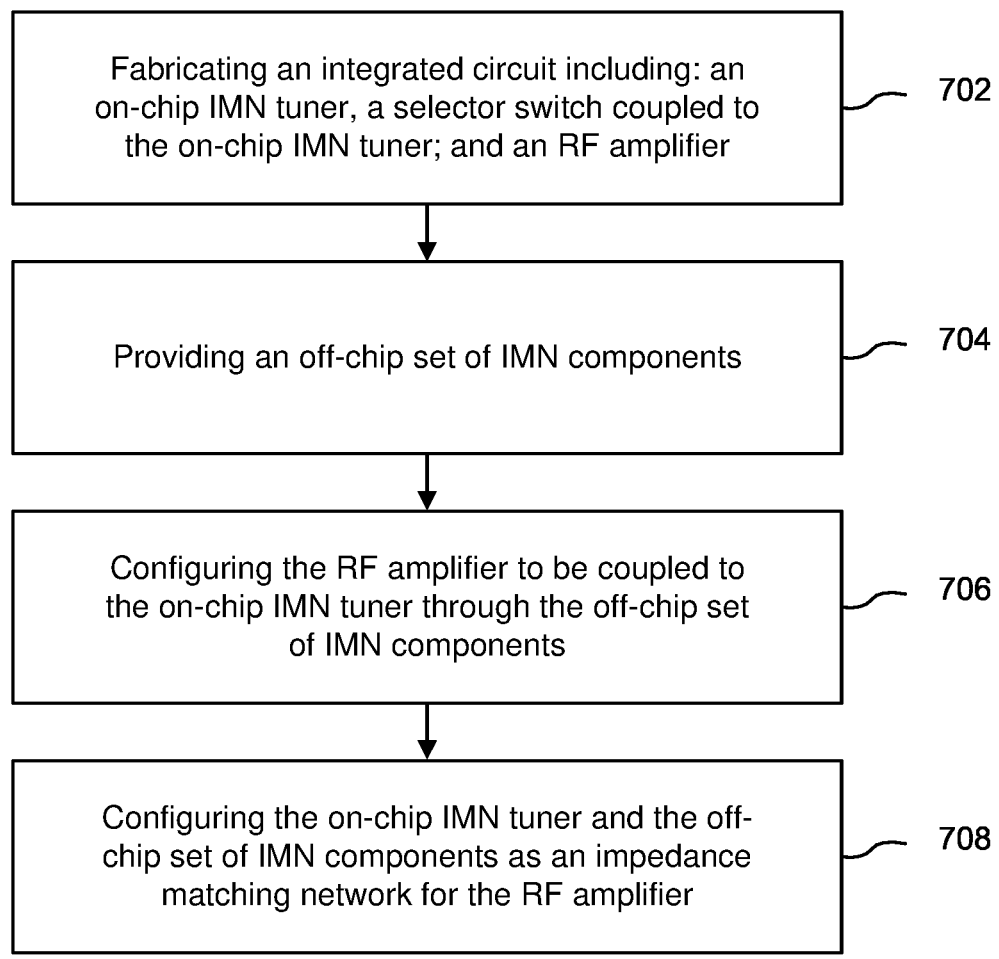
FIG. 7 is a process chart showing a second method for impedance matching an RF amplifier to a coupled selector switch.

As another example, FIG. 7 is a process chart 700 showing a second method for impedance matching an RF amplifier to a coupled selector switch, including: fabricating an integrated circuit including an on-chip IMN tuner, a selector switch coupled to the on-chip IMN tuner, and an RF amplifier (STEP 702); providing an off-chip set of IMN components (STEP 704); configuring the RF amplifier to be coupled to the on-chip IMN tuner through the off-chip set of IMN components (STEP 706); and configuring the on-chip IMN tuner and the off-chip set of IMN components as an impedance matching network for the RF amplifier (STEP 708).

Figure 8:
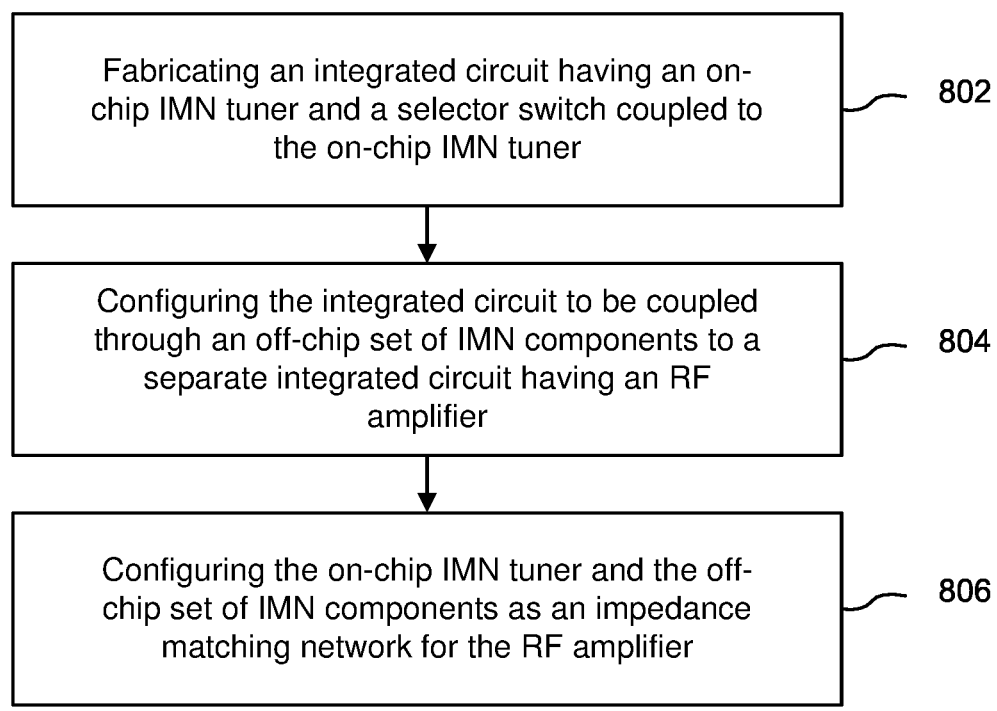
FIG. 8 is a process chart showing a third method for impedance matching an RF amplifier to a coupled selector switch.

As yet a further example, FIG. 8 is a process chart 800 showing a third method for impedance matching an RF amplifier to a coupled selector switch, including: fabricating an integrated circuit having an on-chip IMN tuner and a selector switch coupled to the on-chip IMN tuner (STEP 802); configuring the integrated circuit to be coupled through an off-chip set of IMN components to a separate integrated circuit having an RF amplifier (STEP 804); and configuring the on-chip IMN tuner and the off-chip set of IMN components as an impedance matching network for the RF amplifier (STEP 806).

Other aspects of the above methods may include one or more of: the RF amplifier being one of a power amplifier or a low noise amplifier; fabricating the on-chip IMN tuner on the integrated circuit in close proximity to the selector switch; fabricating on the integrated circuit an on-chip control circuit, coupled to the on-chip IMN tuner, for providing tuning values for the on-chip IMN tuner; the on-chip IMN tuner including a digitally tunable capacitor; at least one of the on-chip IMN tuner and the off-chip set of IMN components comprising a shunt capacitor; and/or coupling a DC blocking capacitor between the on-chip IMN tuner and the selector switch.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 500 Mhz, and particularly above about 1 GHz). Monolithic IC implementation is particularly useful since parasitic inductances and capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) integrated circuit chip including:
   (a) a selector switch including an input port and at least one output port;
   (b) an impedance matching network (IMN) tuner coupled to the input port of the selector switch and configured to be coupled to an off-chip set of IMN components, the IMN tuner including at least one digitally tunable capacitor including a stack of field effect transistors configured to withstand applied high voltage signals; and
   (c) a control circuit, coupled to at least the IMN tuner, configured to provide tuning values for the at least one digitally tunable capacitor;
   wherein the IMN tuner and the off-chip set of IMN components together comprise an impedance matching network.

2. The invention of claim 1, wherein the IMN tuner and the selector switch are integrated in close enough proximity such that the resonant frequency from parasitic inductance is more than about twice the operating frequency of the integrated circuit.

3. The invention of claim 1, further including a DC blocking capacitor coupled between the IMN tuner and the selector switch, and wherein the IMN tuner, the selector switch, and the DC blocking capacitor are integrated in close enough proximity such that the resonant frequency from parasitic inductance is more than about twice the operating frequency of the integrated circuit.

4. The invention of claim 1, wherein the control circuit is configured to provide tuning values for the at least one digitally tunable capacitor in response to applied control signals or words.

5. The invention of claim 1, wherein the control circuit is configured to provide tuning values for the at least one digitally tunable capacitor as a function of one of one or more of a user state selection, external control signals provided through a digital interface, and one or more detected system states or parameters.

6. The invention of claim 1, wherein the control circuit is configured to provide tuning values for the at least one digitally tunable capacitor by means of a feed-forward loop and/or a feed-back loop to dynamically adjust the tuning values as a function of one of one or more of a user state selection, external control signals provided through a digital interface, and one or more detected system states or parameters.

7. The invention of claim 1, wherein the control circuit is coupled to the selector switch and configured to select a signal route from the input port to a selected one of the at least one output port.

8. The invention of claim 1, wherein the IMN tuner and the selector switch are integrated in close enough proximity such that the resulting parasitic inductance is less than about 1.0 nH.

9. The invention of claim 1, wherein the IMN tuner and the selector switch are integrated in close enough proximity such that the resulting parasitic inductance is less than about 0.5 nH.

10. The invention of claim 1, wherein the IMN tuner and the selector switch are integrated in close enough proximity such that the resulting parasitic inductance is about 0.1 nH or less.

11. A radio frequency (RF) integrated circuit chip including:
    (a) a selector switch including an input port and a plurality of output ports, the selector switch configured to route an RF signal applied to the input port as an RF output signal on at least one selected output port;
    (b) an impedance matching network (IMN) tuner coupled to the input port of the selector switch and configured to be coupled to an off-chip set of IMN components, the IMN tuner including at least one digitally tunable capacitor including a stack of at least two field effect transistors coupled in series to withstand applied high voltage signals; and
    (c) a control circuit, coupled to at least the IMN tuner, configured to provide tuning values for the at least one digitally tunable capacitor;
    wherein the IMN tuner and the off-chip set of IMN components together comprise an impedance matching network.

12. The invention of claim 11, wherein the IMN tuner and the selector switch are integrated in close enough proximity such that the resonant frequency from parasitic inductance is more than about twice the operating frequency of the integrated circuit.

13. The invention of claim 11, further including a DC blocking capacitor coupled between the IMN tuner and the selector switch, and wherein the IMN tuner, the selector switch, and the DC blocking capacitor are integrated in close enough proximity such that the resonant frequency from parasitic inductance is more than about twice the operating frequency of the integrated circuit.

14. The invention of claim 11, wherein the control circuit is configured to provide tuning values for the at least one digitally tunable capacitor as a function of one of one or more of a user state selection, external control signals provided through a digital interface, and one or more detected system states or parameters.

15. The invention of claim 11, wherein the control circuit is configured to provide tuning values for the at least one digitally tunable capacitor by means of a feed-forward loop and/or a feed-back loop to dynamically adjust the tuning values as a function of one of one or more of a user state selection, external control signals provided through a digital interface, and one or more detected system states or parameters.

16. The invention of claim 11, wherein the control circuit is coupled to the selector switch and configured to select a signal route from the input port to the at least one selected output port.

17. The invention of claim 11, wherein the IMN tuner and the selector switch are integrated in close enough proximity such that the resulting parasitic inductance is less than about 1.0 nH.

18. The invention of claim 11, wherein the IMN tuner and the selector switch are integrated in close enough proximity such that the resulting parasitic inductance is less than about 0.5 nH.

19. The invention of claim 11, wherein the IMN tuner and the selector switch are integrated in close enough proximity such that the resulting parasitic inductance is about 0.1 nH or less.

20. A method for impedance matching a radio frequency (RF) signal to a coupled selector switch, including:
    (a) fabricating an integrated circuit having an impedance matching network (IMN) tuner and a selector switch coupled to the IMN tuner;
    (b) positioning the IMN tuner and the selector switch on the integrated circuit in close enough proximity such that the resonant frequency from parasitic inductance is more than about twice the operating frequency of the integrated circuit;
    (c) coupling the IMN tuner to an off-chip set of IMN components configured to receive the RF signal; and
    (d) configuring the IMN tuner and the off-chip set of IMN components as an impedance matching network for the received RF signal.

* * * * *